United States Patent
Hack et al.

(10) Patent No.: US 12,016,231 B2
(45) Date of Patent: Jun. 18, 2024

(54) SIMPLIFIED HIGH-PERFORMANCE AMOLED

(71) Applicant: Universal Display Corporation, Ewing, NJ (US)

(72) Inventors: Michael Hack, Carmel, CA (US); Michael Stuart Weaver, Princeton, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 46 days.

(21) Appl. No.: 17/118,938

(22) Filed: Dec. 11, 2020

(65) Prior Publication Data

US 2022/0115458 A1    Apr. 14, 2022

Related U.S. Application Data

(60) Provisional application No. 63/089,854, filed on Oct. 9, 2020.

(51) Int. Cl.
*H10K 59/35* (2023.01)
*H10K 50/19* (2023.01)
*H10K 59/131* (2023.01)

(52) U.S. Cl.
CPC .......... *H10K 59/353* (2023.02); *H10K 50/19* (2023.02); *H10K 59/131* (2023.02); *H10K 59/352* (2023.02)

(58) Field of Classification Search
CPC ........ H01L 27/3216–3218; H10K 59/351–353
See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |

(Continued)

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo et al. Highly efficient phosphorescent emission from organic electroluminescent devices, Nature, vol. 395, pp. 151-154, 1998.

(Continued)

*Primary Examiner* — Eric K Ashbahian
(74) *Attorney, Agent, or Firm* — Butzel Long (57) ABSTRACT

Devices, pixel arrangements, and fabrication techniques thereof are provided for devices that include pixels having red, green, and blue sub-pixels, where the blue sub-pixel is shared among more than one pixel in the arrangement. The display includes fewer than three data lines per pixel and uses only three colors of sub-pixel.

21 Claims, 3 Drawing Sheets

(56) References Cited

U.S. PATENT DOCUMENTS

| | | |
|---|---|---|
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 2003/0230980 A1 | 12/2003 | Forrest |
| 2004/0174116 A1 | 9/2004 | Lu |
| 2013/0285537 A1* | 10/2013 | Chaji ................ H01L 27/3218 445/24 |
| 2016/0218150 A1* | 7/2016 | Hack .................. H01L 51/5056 |
| 2016/0240593 A1* | 8/2016 | Gu ....................... G09G 3/3225 |
| 2017/0229663 A1 | 8/2017 | Tsai |
| 2020/0081309 A1* | 3/2020 | Lee .................. G02F 1/136286 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

C.H. Brown Elliott, et al., "Development of the PenTile Matrix(TM) AMLCD subpixel architecture and rendering algorithms", Journal of the SID 11/1, 2003, pp. 89-98.

\* cited by examiner

SIMPLIFIED HIGH-PERFORMANCE AMOLED

CROSS-REFERENCE TO RELATED APPLICATIONS

This application is a non-provisional of and claims the priority benefit of U.S. Provisional Patent Application Ser. No. 63/089,854, filed Oct. 9, 2020, the entire contents of which are incorporated herein by reference.

FIELD

The present invention relates to pixel arrangements for organic emissive devices, such as organic light emitting diodes, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component. When used in conjunction with a sub-pixel or emissive material, generally "white" is not considered a "single color" since typically it requires multiple emissive materials to achieve white emission. Accordingly, unless specifically indicated otherwise or required by context, a sub-pixel of a single color as described herein does not emit white light. As used herein, "single color" emission refers to a spectrum that has a peak with a full-width at half-maximum (FWHM) of less than 100 nm.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; Interior: [0.2268, 0.3321] |
| Central Yellow | Locus: [0.3731, 0.6245]; [0.6270, 0.3725]; Interior: [0.3700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

Embodiments disclosed herein provide devices, arrangements, and techniques for achieving a full-color OLED display panel that includes a plurality of pixels, each of which includes a red, green, and blue sub-pixel, with the blue sub-pixel being shared among more than one of the pixels. The display panel includes data lines to provide display data to the sub-pixels, with the display panel including fewer than three data lines per pixel and only three colors of sub-pixels. The blue sub-pixel may be shared among, for example, at least two, four, six, or more sub-pixels. The blue sub-pixel may have a different area than the others, for example, 0.5, 0.75, 1, 1.05, 1.1, 1.2, 1.25, 1.5, 2, 3, 4, 5, 6, 7, or 8 times or more times the area of the red and/or green sub-pixels, or any intervening relative size. The blue sub-pixel resolution may be different than the red and/or green; for example, the distance from one blue sub-pixel to the next blue sub-pixel may be greater than the total distance across the each pixel, measured across the panel and parallel either to a scan line or a data line of the display panel. Some or all of the sub-pixels may have a stacked architecture. Since each pixel includes each sub-pixel color, each pixel may independently be capable of displaying a full range of color including white. The blue sub-pixels may be arranged in columns parallel to edges of the display, or may be staggered. The display panel may include power lines for the blue sub-pixels and/or any stacked sub-pixels that are separate from those used by the other sub-pixels. Embodiments disclosed herein may be fabricated with only three depositions of different colors of emissive materials. Electronic devices including display panels disclosed herein may include, for example, wherein the consumer product is selected from the group consisting of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a microdisplay that is less than 2 inches diagonal, a 3-D display, a virtual reality or augmented reality display, a vehicle, a video walls comprising multiple displays tiled together, a theater or stadium screen, a light therapy device, and a sign.

In an embodiment a method of fabricating an OLED display panel is provided, which includes depositing a plurality of OLED emissive materials over a backplane to form an OLED display panel comprising a plurality of pixels, each pixel comprising a plurality of sub-pixels including a blue sub-pixel, wherein each blue sub-pixel is shared among more than one pixel of the plurality of pixels, where the backplane has fewer than three data lines per pixel. Each blue sub-pixel may be shared among at least two, four, or more pixels. The method may include no more than three emissive material depositions. The blue sub-pixels may be aligned in columns within the fabricated panel, or may be staggered. The backplane may include power lines for blue sub-pixels in the display that are separate from power lines for other colors of sub-pixels in the display. The structure of the fabricated device may include any of the features described with respect to the OLED display panels herein, in any combination.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
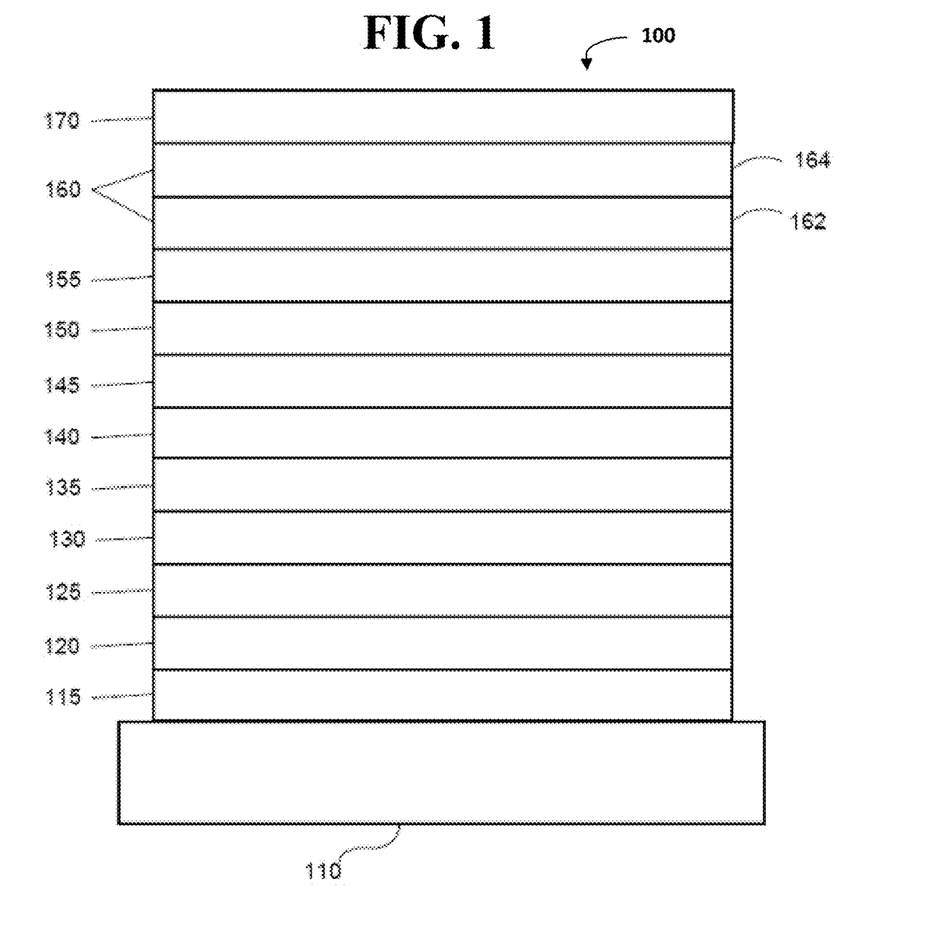
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
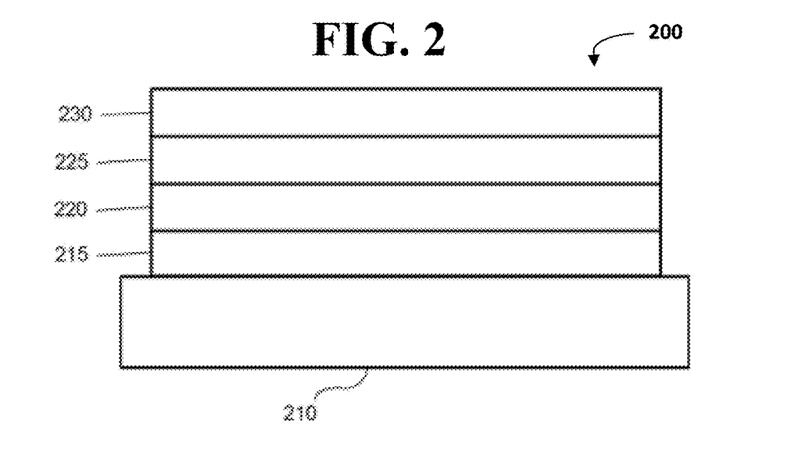
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, a light therapy device, and a sign. Various control mechanisms may be used to control sub-pixels within devices fabricated in accordance with the present invention, including passive matrix and active matrix driving circuits. Many of the devices are intended for use in a temperature range comfortable to humans, such as 18° C. to 30° C., and more preferably at room temperature (20-25° C.), but could be used outside this temperature range, for example, from −40° C. to 80° C. The consumer product also may be or include a wearable device.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Different emissive mechanisms can be used to emit light in these devices. Phosphorescence, fluorescence, phosphorescent sensitized fluorescence or thermally assisted delayed fluorescence (TADF) may all be employed. In phosphorescent OLEDs close to 100% internal quantum efficiency can be realized. It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AES-T. These states may involve CT states. Often, donor-acceptor luminescent materials are constructed by connecting an electron donor moiety such as amino- or carbazole-derivatives and an electron acceptor moiety such as N-containing six-membered aromatic ring.

OLED materials and structures disclosed herein may operate via any suitable emissive mechanism, including but not limited to TADF, phosphor-sensitized TADF, and phosphor sensitized fluorescence.

Some OLED display panels use pixel arrangements in which sub-pixels may be "shared" between multiple pixels. This reflects the way that the human eye sees light, with many more cone receptors for red and green light than for blue light. So the human eye spatial resolution for blue light is much lower than for green or red light. One such example of "shared" pixels is the PenTile matrix technology, which refers to a sub-pixel design architecture family. The basic PenTile structure is the RGBG (red-green-blue-green) matrix. In RGBG PenTile displays there are only two sub-pixels per pixel, with twice as many green pixels than red and blue sub-pixels. In a conventional display each pixel or group of subpixels can render any color on the screen, regardless of neighboring pixels. This is not the case with PenTile screens.

PenTile RGBW technology, used in LCD devices, adds an extra subpixel to the traditional red, green and blue subpixels that is a clear area without color filtering material and with the purpose of letting the white backlight light emit white light without color filtering, hence W for white. This makes it possible to produce a brighter image compared to an RGB-matrix while using the same amount of power, or produce an equally bright image while using less power.

Another PenTile layout is the Pentile RGBW layout which uses each red, green, blue and white subpixel to present high-resolution luminance information to the human eyes' red-sensing and green-sensing cone cells, while using the combined effect of all the color subpixels to present lower-resolution chroma (color) information to all three cone cell types. Combined, this optimizes the match of display technology to the biological mechanisms of human vision. The layout uses one third fewer subpixels for the same resolution as the RGB stripe (RGB-RGB) layout, in spite of having four color primaries instead of the conventional three, using subpixel rendering combined with metamer rendering. Metamer rendering optimizes the energy distribution between the white subpixel and the combined red, green, and blue subpixels: W< >RGB, to improve image sharpness. Although some PenTile displays and other similar "shared" sub-pixel arrangements may have fewer data lines per pixel than a conventional display, each individual pixel does not contain sub-pixels of each primary color (e.g., red, green, and blue), and thus is not able to display a full range of colors including white.

Figure 3:
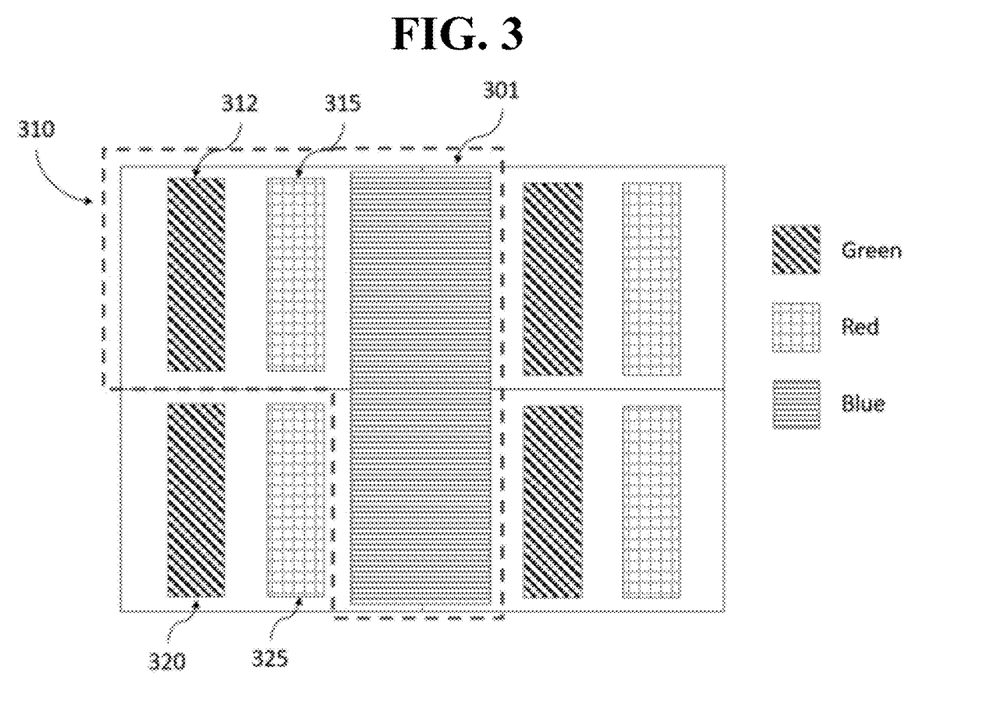
FIG. 3 shows an arrangement of sub-pixels and pixels in which one blue sub-pixel is shared among four pixels according to an embodiment disclosed herein.

Embodiments disclosed herein provide display panel arrangements in which blue sub-pixels are shared among more than one pixel, but which only use fewer than three data lines per pixel while including only three colors of sub-pixels in the display. FIG. 3 shows an example display panel arrangement in which a blue sub-pixel is shared among four pixels. In this example, the blue sub-pixel 301 is arranged between four pixels, each of which includes a separate red and green sub-pixel. One such pixel 310 is shown in which a red sub-pixel 315, a green sub-pixel 312, and the blue sub-pixel 301 form a single pixel. Similarly, the lower-left red sub-pixel 325 and green sub-pixel 320 form a pixel with the same blue sub-pixel 301, and so on for the upper-right and lower-right green/red sub-pixel combinations. Therefore, in embodiments disclosed herein, each pixel contains sub-pixels of each of the three primary colors, red, green and blue. In this arrangement, the blue sub-pixel 301 is activated whenever blue emission is required by one or more of the full-color pixels such as the pixel 310. If a blue sub-pixel is shared by 4 pixels, then its intensity will be related to the sum of the blue luminance that would be required by the four pixels combined.

FIG. 3 shows an arrangement in which the blue sub-pixel is shared among four pixels. More generally, a blue sub-pixel may be shared among two, four, eight, or more pixels. For example, in an arrangement in which the blue sub-pixel is shared among two pixels, the blue sub-pixel would not extend to the lower row of red and green sub-pixels; instead, a separate blue sub-pixel may be positioned at the same location as the lower half of the blue sub-pixel 301 shown in FIG. 3. Similarly, a blue sub-pixel may extend across three or four lines of red/green sub-pixels in the same general arrangement as shown in FIG. 3 to allow for the blue sub-pixel to be shared among six or eight pixels.

Although the example shown in FIG. 3 shows red and green sub-pixels of the same size and a shared blue sub-pixel that is about four times the size of the red and green sub-pixels, more generally differently-sized red and green sub-pixels may be used, and/or the relative size of the blue sub-pixel may be different. For example, the blue sub-pixel may be exactly or at least 0.5, 0.75, 1, 1.05, 1.1, 1.2, 1.25, 1.5, 2, 3, 4, 5, 6, 7, or 8 times the size of the larger of the red and green sub-pixels, or any intervening size. In some cases, depending on the deposition techniques used, the total deposition of one or more colors may be different than the active area of that color of pixel, and/or the ratio of the area of the blue sub-pixel to red and/or green sub-pixels may not be an exact integer.

Figure 4:
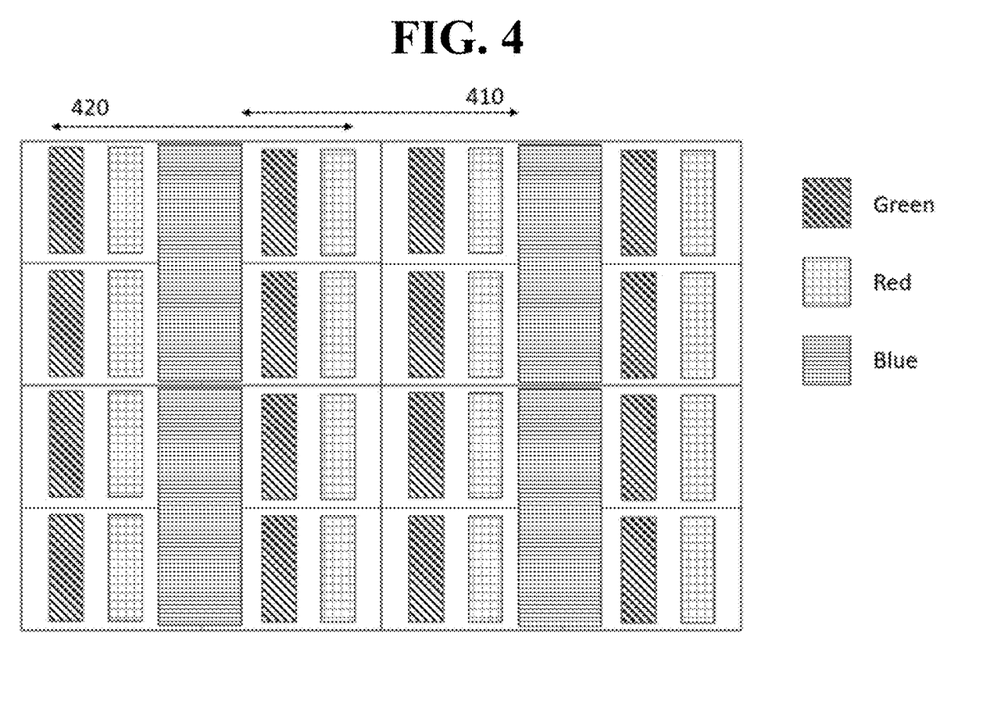
FIG. 4 shows an arrangement of pixels in which shared blue sub-pixels are aligned according to an embodiment disclosed herein.

The arrangement shown in FIG. 3 may be repeated across a display panel or portion of a display panel. In some cases, it may be desirable to align the blue sub-pixels as shown in FIG. 4. In this arrangement, the blue sub-pixels are aligned in columns across the display panel. This may allow for the use of various fabrication techniques, such as OVJP techniques, in which columns of emissive material may be deposited on the display panel substrate relatively efficiently and with little or no masking or alignment required.

In some cases, the pixels may be arranged such that the distance from one blue sub-pixel to the next blue sub-pixel is greater than the total distance across each pixel, measured across the panel and parallel either to a scan line or a data line of the display panel. For example, in FIG. 4 the distance 410 from one blue sub-pixel to the next blue sub-pixel in the same row may be greater than the total distance across the pixel 420, i.e., the resolution of blue sub-pixels alone may be less than the resolution of red or green sub-pixels in the display.

Figure 5:
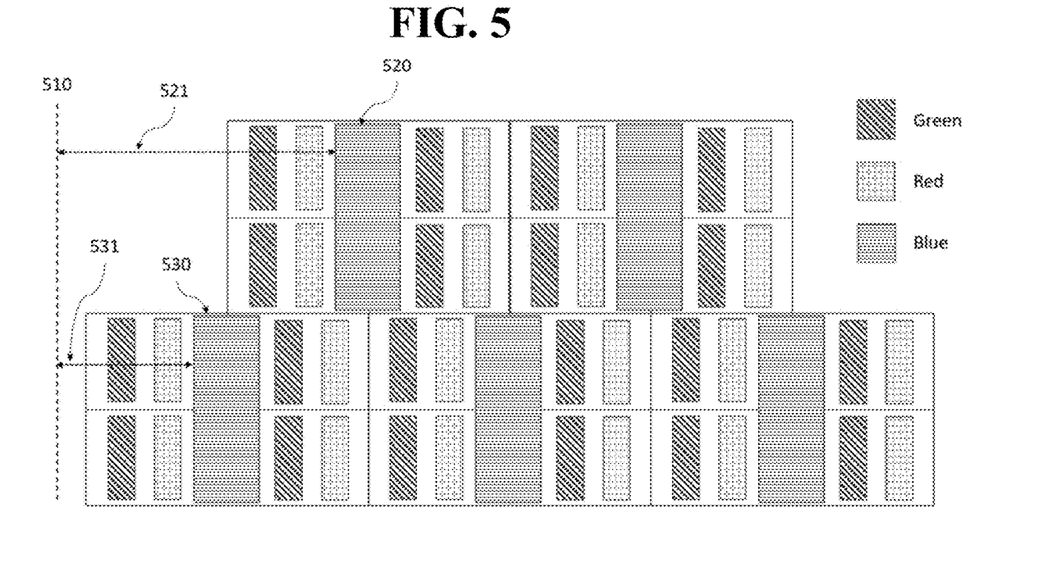
FIG. 5 shows an arrangement of pixels in which shared blue sub-pixels are staggered according to an embodiment disclosed herein.

Alternatively, the blue sub-pixels may be staggered as shown in FIG. 5. In contrast to an arrangement as shown in FIG. 4, in this staggered arrangement the blue sub-pixels are not aligned in columns parallel to an edge of the display panel. Rather, the blue sub-pixels (and the complete pixels) are arranged at varying distances relative to the edge of the display panel or a line parallel to an edge of the display panel. For example, the line 510 may be an edge of the display panel or a line parallel to an edge of the display panel. The blue sub-pixels 520, 530 are disposed at different distances 521, 531 from the line, although they are in adjacent rows. In this arrangement, there is not a blue sub-pixel in a row adjacent to the row in which the blue sub-pixel 520 is disposed that is the same distance from the line 510. However, the two-row pattern shown in FIG. 5 may be repeated, such that alternating rows of pixels include blue sub-pixels that are the same distance from an edge of the display panel or a line parallel to the edge. In contrast, in the arrangement shown in FIG. 4, each blue sub-pixel is in a column that is a constant distance from the edge of the display panel or a line equivalent to the line 510, although sub-pixels in other columns may be disposed at different distances from the line.

Full-color OLED display panels as disclosed herein include electronic circuits to drive each sub-pixel, either built into a silicon substrate, deposited as thin film transistors and other components, or attached through a bonding process, where data lines provide display data to the sub-pixels through these electronic circuits. Arrangements disclosed herein may use fewer than three data lines per pixel across the display, while the display includes sub-pixels of only three colors. For example, referring again to FIG. 3, the arrangement shown includes four pixels, but may use only 10 data lines (one for each sub-pixel), thereby achieving a full-color display with fewer than three data lines per pixel. Similarly, the arrangement shown in FIG. 4 includes 16 pixels but may provide a full-color display using only 36 data lines (one per sub-pixel; 2.25 data lines per pixel). Extending the arrangements shown in FIGS. 3 and 4 and other illustrative arrangements shown and described herein similarly achieves full display panels that include fewer than three data lines per pixel.

Notably, in arrangements disclosed herein, each pixel is capable of rendering white light by concurrently activating the red, green, and blue sub-pixels that make up the pixel. For example, referring again to FIG. 3, white light may be rendered with the upper-left sub-pixel 310 by concurrent activation of the red, green, and blue sub-pixels 315, 312, 301, respectively. Similarly, each combination of red/green sub-pixels with the blue sub-pixel 301 may be activated to render white light by the respective pixel. Such per-pixel white emission typically is not possible with other shared sub-pixel arrangements, in which not every pixel includes every color of sub-pixel, or in which there is not a conventional "pixel" arrangement. In contrast, in other "shared" sub-pixel arrangements such as PenTile displays, each pixel contains only two sub-pixels and whichever of the three primary colors is missing in one pixel will be present in an adjacent pixel. Special software algorithms must be used to ensure that the overall image appears faithfully when viewed from a normal distance, even though not every pixel can produce every color on its own.

Embodiments disclosed herein also provide additional benefits over conventional side-by-side (SBS) OLED fabrication techniques and devices. For example, a standard RGB SBS pixel requires 3 OLED depositions and patterning techniques require an alignment tolerance between each color active area. As display resolution increases the alignment tolerances reduce the effective active area of each emissive region, reducing the fill-factor and requiring increased sub-pixel luminance as compensation, decreasing subpixel lifetime and increasing voltage/power. This may create significant lifetime problems, especially for blue sub-pixels. Because the human eye has much lower spatial resolution for deep blue than for red or green, sharing a deep blue sub-pixel among two or more pixels as disclosed herein generally will result in minimal or no observable difference from conventional SBS arrangements.

The number of pixels the blue is shared with may be selected based on the display panel resolution, the final end application, and/or the specific CIE coordinates of a particular blue deposition. In the designs disclosed herein, area that was an alignment tolerance dead zone or non-emissive region in a conventional design may be used as an active emissive area, thereby allowing for doubling or more the blue fill factor relative to conventional displays, and also allowing a 4× (or more) increase in blue lifetime. More generally, this allows for more active area available to whichever sub-pixel or pixel arrangement is desired for a particular display arrangement. For example. In addition, the number of data lines is reduced as previously disclosed, thereby lowering driver chip costs. In a transparent display this also may improve display transparency, partly because of reduced number of opaque data lines and partly because there will be fewer TFTs in the backplane as fewer sub-pixel driving circuits are required.

In some embodiments, each pixel disclosed herein may include a red, green, and shared blue sub-pixel as previously disclosed, where the blue sub-pixel is shared among two or more pixels. Furthermore, each sub-pixel may have an unfiltered architecture. That is, it may not use any color filters, up- or down-conversion layers or other color-altering layer, such that the light emitted by each sub-pixel is unchanged from the light initially generated by the emissive materials in the sub-pixel. In some embodiments, the light may be modified only by microcavity effects, including from microcavity structures intentionally arranged in a stack with individual sub-pixel structures. Alternatively, one or more sub-pixels may include one or more color-altering layers of any type. Such configurations may still use sub-pixels that each are a single color. This allows the device to be more efficient and/or simpler to fabricate compared to other arrangements known in the art that use multiple emissive materials in each sub-pixel to produce white light initially, which is then filtered with one or more color-altering components to produce the desired color emission for each sub-pixel. In some embodiments, microcavities or microcavity effects may be used in conjunction with one or more color-altering layers or components.

Figure 6:
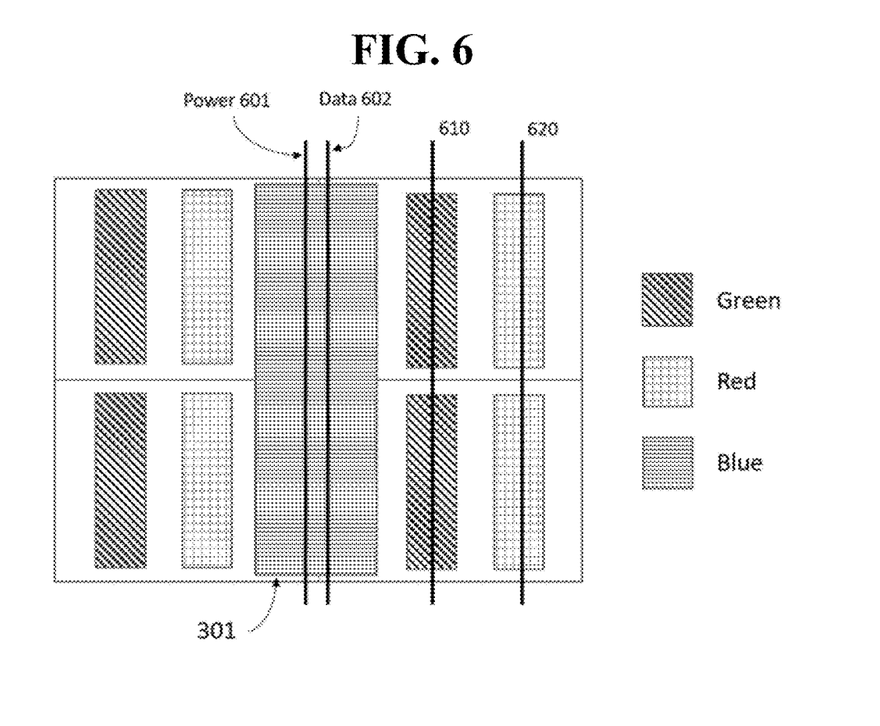
FIG. 6 shows an example sub-pixel layout that allows for three lines per pixel to support both RGB data and a separate power line for a blue sub-pixel such as a stacked sub-pixel according to an embodiment disclosed herein.

Because the arrangements disclosed herein require fewer data lines than conventional arrangements, the "saved" data lines from a conventional design of one data line per sub-pixel color may be used as additional power lines. As a result, architectures disclosed herein may be used to support a stacked blue sub-pixel (such as described in U.S. Pat. No. 9,170,665) with a separate power line for the blue sub-pixels as compared to red and green. For example, considering two vertical lines for every two pixels, one of these lines may be the data line for the blue sub-pixel and one a separate power line. This display architecture thus supports a twelve-fold increase in blue lifetime (4× from layout and 3× from stacking) with no additional common supply lines within the array. An example of such an arrangement is shown in FIG. 6, which shows examples of data and power lines overlaid with the basic four-pixel arrangement shown in FIG. 3. In this example, the blue sub-pixel 301 may be driven by a dedicated power line 601 and a data line 602. The green and red sub-pixels may have separate data lines 610, 620, as shown. This architecture could also be used if the blue and one other color (green or red) subpixels are stacked and the third color subpixel is not stacked, or more broadly if any color has a different number of stacks of emissive layer in its subpixels (and therefore needs a different drive voltage or other operating parameter) compared to other colors.

Pixel arrangements and display panels as disclosed herein may be fabricated over a substrate using any suitable technique, including those disclosed herein with respect to individual OLED devices as shown in FIGS. 1 and 2. In some cases only three depositions of different emissive colors may be used, such as one deposition for each sub-pixel color (red, green, blue). As a specific example, an array of OVJP jets may be used to deposit one or more colors of sub-pixels across the display panel, such as where continuous lines of red, green, and blue emissive material are deposited across the columns that make up the sub-pixels as previously shown and described. As another example, OVPD or similar techniques may be used to deposit each color of emissive material directly or through a mask onto the panel substrate. Generally, the OLED emissive materials may be deposited over a backplane that includes the associated control and power circuitry as previously disclosed. The backplane may include fewer than three data lines per pixel and may include separate power lines for blue sub-pixels in the display as previously disclosed.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A full-color organic light emitting diode (OLED) display panel comprising:
   a plurality of pixels, each pixel comprising a plurality of sub-pixels including:
      a red sub-pixel comprising a red emissive layer configured to emit red light,
      a green sub-pixel comprising a green emissive layer configured to emit green light, and
      a blue sub-pixel comprising a blue emissive layer configured to emit blue light,
   wherein each blue sub-pixel is shared among more than one pixel of the plurality of pixels; and
   a plurality of data lines to provide display data to sub-pixels in the plurality of pixels;
   wherein the display panel has an overall data line-to-pixel ratio of more than two data lines per pixel and fewer than three data lines per pixel and the display contains only three colors of sub-pixels; and
   wherein the display panel comprises a single scan line for each row of pixels in the display panel.

2. The display panel of claim 1, wherein each blue sub-pixel is shared among at least two pixels.

3. The display panel of claim 2, wherein each blue sub-pixel is shared among at least four pixels.

4. The display panel of claim 2, wherein the area of the blue sub-pixel is at least 1.5 times the area of the larger of the red sub-pixel and the green sub-pixel.

5. The display panel of claim 4, wherein the area of the blue sub-pixel is at least twice the area of the larger of the red sub-pixel and the green sub-pixel.

6. The display panel of claim 5, wherein the area of the blue sub-pixel is at least four times the area of the larger of the red sub-pixel and the green sub-pixel.

7. The display panel of claim 6, wherein the area of the blue sub-pixel is at least six times the area of the larger of the red sub-pixel and the green sub-pixel.

8. The display panel of claim 7, wherein the area of the blue sub-pixel is at least eight times the area of the larger of the red sub-pixel and the green sub-pixel.

9. The display panel of claim 1, wherein the distance from one blue sub-pixel to the next blue sub-pixel is greater than the total distance across the each pixel, measured across the panel and parallel either to a scan line or a data line of the display panel.

10. The display panel of claim 1, wherein the blue sub-pixel has a stacked architecture.

11. The display panel of claim 10, wherein at least one of the red sub-pixel and the green sub-pixel has a stacked architecture.

12. The display panel of claim 1, wherein at least one of the red sub-pixel and the green sub-pixel has a stacked architecture.

13. The display panel of claim 1, wherein each pixel in the display panel is capable of rendering white.

14. The display panel of claim 1, wherein blue sub-pixels in the display panel are aligned in columns parallel to an edge of the display panel.

15. The display panel of claim 1, wherein blue sub-pixels in the display panel are staggered relative to a line parallel to an edge of the display panel.

16. The display panel of claim 1, further comprising power lines for blue sub-pixels in the display that are separate from power lines for other colors of sub-pixels in the display.

17. The display panel of claim 1, wherein at least some sub-pixels in the display panel comprise a stacked architecture, the display panel further comprising power lines for the stacked sub-pixels in the display that are separate from power lines for sub-pixels in the display having single junction emissive layers.

18. The display panel of claim 1, wherein the display panel is fabricated using a technique that requires no more than three depositions of different colors of emissive materials.

19. A consumer electronic device comprising:
a full-color organic light emitting diode (OLED) display panel comprising:
  a plurality of pixels, each pixel comprising a plurality of sub-pixels including:
    a red sub-pixel comprising a red emissive layer configured to emit red light,
    a green sub-pixel comprising a green emissive layer configured to emit green light, and
    a blue sub-pixel comprising a blue emissive layer configured to emit blue light,
  wherein each blue sub-pixel is shared among more than one pixel of the plurality of pixels; and
  a plurality of data lines to provide display data to sub-pixels in the plurality of pixels;
wherein the display panel has an overall data line-to-pixel ratio of more than two data lines per pixel and fewer than three data lines per pixel and the display contains only three colors of sub-pixels; and
wherein the display panel comprises a single scan line for each row of pixels in the display panel.

20. The display panel of claim 1, wherein the total number of sub-pixels in the full-color OLED display panel is less than three times the number of pixels.

21. The consumer electronic device of claim 19, wherein the consumer product is selected from the group consisting of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, a light therapy device, and a sign.

* * * * *